United States Patent
Hirata et al.

(10) Patent No.: US 7,355,405 B2
(45) Date of Patent: Apr. 8, 2008

(54) MAGNETIC RESONANCE IMAGING SYSTEM AND MAGNETIC RESONANCE IMAGING METHOD

(75) Inventors: Satoshi Hirata, Kodaira (JP); Hisaaki Ochi, Kodaira (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 11/630,766

(22) PCT Filed: Jul. 20, 2005

(86) PCT No.: PCT/JP2005/013282

§ 371 (c)(1),
(2), (4) Date: Dec. 27, 2006

(87) PCT Pub. No.: WO2006/040866

PCT Pub. Date: Apr. 20, 2006

(65) Prior Publication Data

US 2007/0241754 A1     Oct. 18, 2007

(30) Foreign Application Priority Data

Oct. 13, 2004  (JP) ............................ 2004-298476

(51) Int. Cl.
*G01V 3/00* (2006.01)
(52) U.S. Cl. ...................... 324/307; 324/309
(58) Field of Classification Search ........ 324/300–322; 600/407–455
See application file for complete search history.

(56) References Cited

U.S. PATENT DOCUMENTS 5,111,819 A * 5/1992 Hurd ........................ 600/410

(Continued)

FOREIGN PATENT DOCUMENTS

JP         63-230156         9/1988

(Continued)

OTHER PUBLICATIONS

J. Granot, "Selected Volume Excitation Using Stimulated Echoes (VEST). Applications to Spatially Localized Spectroscopy and Imaging", Journal of Magnetic Resonance, vol. 70, pp. 488-492, 1986.

(Continued)

*Primary Examiner*—Brij Shrivastav
(74) *Attorney, Agent, or Firm*—Antonelli, Terry, Stout & Kraus, LLP.

(57) ABSTRACT

Provided is a magnetic resonance imaging system capable of reducing degradation in a magnetic resonance spectrum derived from a change in a static magnetic field. A sequence controller performs non-water-suppressed spectrum measurement (pre-scan) cyclically during water-suppressed spectrum measurement (main scan) accompanied by repetitive measurement intended for averaging of signals, and cyclically detects a water resonant frequency (water-signal peak position) and a phase value at a water-signal peak from an obtained non-water-suppressed spectrum (the cyclic pre-scan makes it possible to sense a time-varying rate of static magnetic field strength (resonant frequency)). For the water-suppressed spectrum measurement (main scan) succeeding the pre-scan, a reception-initiating phase value that is used to detect a magnetic resonance signal is set to a value calculated using the phase value at the water-signal peak position detected during the pre-scan. For averaging of measured magnetic resonance signals, data items are shifted by the value calculated from the phase value at the water-signal peak position detected during the pre-scan. Thereafter, the averaging is carried out.

9 Claims, 7 Drawing Sheets

U.S. PATENT DOCUMENTS

| | | | |
|---|---|---|---|
| 5,818,230 A * | 10/1998 | Katz et al. | 324/309 |
| 5,903,149 A * | 5/1999 | Gonen et al. | 324/307 |
| 6,023,634 A * | 2/2000 | Hanawa et al. | 600/410 |
| 6,069,478 A * | 5/2000 | Hurd | 324/307 |
| 6,891,371 B1 * | 5/2005 | Frigo et al. | 324/307 |

FOREIGN PATENT DOCUMENTS

| | | |
|---|---|---|
| JP | 11-076191 | 3/1999 |
| JP | 2002-291718 | 10/2002 |
| WO | WO 2005/000116 | 1/2005 |

OTHER PUBLICATIONS

D. Norris, et al., "Fast Proton Spectroscopic Imaging Using the Sliced k-Space Method" MRM 30, pp. 641-645, 1993.

* cited by examiner

MAGNETIC RESONANCE IMAGING SYSTEM AND MAGNETIC RESONANCE IMAGING METHOD

TECHNICAL FIELD

The present invention relates to a magnetic resonance imaging technology, or more particularly, to a magnetic resonance imaging system and a magnetic resonance imaging method which are preferable for measurement of a magnetic resonance signal that contains information on a chemical shift.

BACKGROUND ART

Magnetic resonance imaging systems excite nuclear magnetizations of respective protons contained in a subject, who is placed in a static magnetic field, by irradiating a radiofrequency magnetic field of a specific frequency to the subject (magnetic resonance phenomenon), detect a magnetic resonance signal generated from the subject, and thus acquire physical or chemical information. Magnetic resonance imaging (hereinafter abbreviated to MRI) that has widely prevailed provides an image which reflects a density distribution of a proton contained mainly in each of water molecules in the subject. In contrast to the MRI, a method of separating one magnetic resonance signal from others in units of a molecule on the basis of a difference in a resonance frequency derived from a difference in chemical bonding of one molecule containing a proton from other various molecules each containing the proton (referred to as a chemical shift) shall be called magnetic resonance spectroscopy (hereafter abbreviated to MRS) (refer to, for example, "Journal of Magnetic Resonance" (vol. 70, pp. 488-492, 1986)).

Moreover, a method of simultaneously acquiring spectra which represent numerous areas (pixels) so as to visualize each molecule is called magnetic resonance spectroscopic imaging (hereinafter abbreviated to MRSI). The adoption of the MRIS makes it possible to visually grasp a concentration distribution of each metabolite (refer to, for example, "MRM 30" (pp. 641-645, 1993)).

Normally, the concentration of a metabolite contained in a subject is often very low. When the MRS or MRSI is performed for measurement, unless a signal of high-concentration water is suppressed, a feeble signal of a metabolite is buried in the skirt extending from the peak of the strong signal generated from water. This makes it difficult to separate or sample the metabolite signal. Consequently, in the existing MRS or MRSI, preprocessing intended to suppress the water signal is performed immediately previously of normal excitation and detection.

During the processing intended to suppress the water signal, first, a radiofrequency magnetic field is irradiated with a transmission frequency set to the frequency at the position of the peak of the water signal and an excitation frequency band narrowed to the peak width of the water signal. This is intended to excite only nuclear magnetizations contained in water molecules. Thereafter, the phases of the nuclear magnetizations contained in the excited water molecules are differentiated from one another, and a dephasing magnetic field is applied in order to nullify the sum of the magnetization vectors (pseudo saturation). While the pseudo saturation of the nuclear magnetizations in the water molecules continues, normal excitation and detection are performed in order to measure a feeble signal of a metabolite.

Moreover, since a signal of a metabolite is quite feeble, as long as measurement is performed conventionally through the MRS or MRSI, numerous averagings and measurements have to be performed in order to improve a signal-to-noise ratio (SNR) of an obtained spectrum.

DISCLOSURE OF INVENTION

In the conventional measurement through MRS or MRSI, after measurement of a magnetic resonance signal is repeated under the same conditions for measurement on the assumption that static magnetic field strength remains temporally constant, acquired magnetic resonance signals are averaged. In other words, in normal measurement, first (prior to water-suppressed spectrum measurement accompanied by repetitive measurement intended for averaging of signals), a spectrum is measured at least once with a water signal non suppressed in order to detect the resonant frequency of water. During the measurement through MRS or MRSI to be performed succeedingly to the measurement of the water resonance frequency, signal measurement is repeated on the assumption that the static magnetic field strength (resonant frequency) remains temporally constant (that is, on the assumption that the position of a peak of each metabolite signal in a measured spectrum or the phase of the signal will not change), averaging of signals that is summation of acquired signals is carried out.

However, depending on the structure of a magnet that generates a static magnetic field or the property thereof and a measurement environment, static magnetic field strength (resonant frequency) may change during the measurement through MRS or MRSI. In this case, according to the foregoing conventional method, even when measurement is repeated for the purpose of averaging, the position of a peak of each metabolite signal or the phase of the signal (which will be described later) varies along with a shift in a resonant frequency. This poses a problem in that the improvement of an SNR due to averaging is not fully attained. Moreover, when the peak position changes, the peak width in an averaged spectrum widens. Eventually, a spectral resolution is degraded.

The phase of a signal will be described below. In a normal magnetic resonance imaging system to which the present invention is adapted, a complex wave of a magnetic resonance signal is detected according to a technique referred to as phase detection. Specifically, according to the phase detection method, an irradiation radiofrequency signal is adopted as a reference wave. When a difference of a detected magnetic resonance signal from the reference wave signal is calculated, the detected magnetic resonance signal is classified into a frequency component higher than the irradiation radiofrequency magnetic field (a positive-sign wave) or a frequency component lower than that (a negative-sign wave). The signs associated with the frequency components are reflected as phases. The component in phase with the irradiation radiofrequency magnetic field and the component 90° out of phase therewith are detected simultaneously.

Consequently, a measured magnetic resonance signal always includes a real part (abbreviated to Re) and an imaginary part (abbreviated to Im). A signal phase $\phi(Pw)$ at a peak position (Pw) in a spectrum resulting from complex Fourier transform is provided by the following formula (formula 1):

$$\phi(Pw) = \tan^{-1}(Im(Pw)/Re(Pw)) \quad (1)$$

Assuming that static magnetic field strength (resonant frequency) varies and received signals to be averaged become out of phase with one another, averaging to be performed for each of real-part signals and imaginary-part signals does not provide a satisfactory effect of summation.

The reason why phase detection is employed in a normal magnetic resonance imaging system lies in a point that the phase detection improves an SNR compared with normal detection (diode detection or any other non phase detection). The mechanism will be described below. Since an irradiation radiofrequency magnetic field is employed in excitation of nuclear magnetizations, the phase of a component of a magnetic resonance signal excited by the irradiation radiofrequency magnetic field perfectly agrees with the phase of the irradiation radiofrequency magnetic field. In contrast, the phase of a noise component convoluted to the magnetic resonance signal has no correlation with the phase of the irradiation radiofrequency magnetic field. Consequently, the phases of components contained in the real-part signal and imaginary-part signal that are detected in terms of phases correlate with each other, but the phase of the convoluted noise component has no correlation. This results in an improved SNR.

An object of the present invention is to provide a magnetic resonance imaging system and a magnetic resonance imaging method capable of reducing degradation of a magnetic resonance spectrum caused by a change in a static magnetic field.

In order to accomplish the above object, in a magnetic resonance imaging system and a magnetic resonance imaging method in accordance with the present invention, non-water-suppressed spectrum measurement (pre-scan) is performed cyclically during water-suppressed spectrum measurement (main scan) accompanied by repetitive measurement intended for averaging of signals. A water resonant frequency (water-signal peak position) and the phase value at the peak of a water signal are cyclically detected from an obtained non-water-suppressed spectrum (the cyclic pre-scan makes it possible to sense a time-varying rate of static magnetic field strength (resonant frequency)). During the water-suppressed spectrum measurement (main scan) succeeding the pre-scan, a reception-initiating phase value that is used for detection of a magnetic resonance signal is set to a value calculated from the waver-signal phase position detected during the pre-scan. For averaging of measured magnetic resonant signals, the averaging is performed after data items are shifted by the value calculated from the water-signal peak position detected during the pre-scan. Herein, control may be extended in order to perform at least one of the setting of the phase value and the shifting of the water-signal peak position.

Moreover, in a magnetic resonance imaging system and a magnetic resonance imaging method in accordance with the present invention, non-water-suppressed spectrum measurement (pre-scan) is performed cyclically during water-suppressed spectrum measurement (main scan) accompanied by repetitive measurement intended for averaging of signals. Phase changes in obtained non-water-suppressed time-sequential signals are detected and recorded (this cyclic pre-scan makes it possible to sense a time-varying rate of static magnetic field strength (resonant frequency)). During the water-suppressed spectrum measurement (main scan) succeeding the preliminary measurement, phase correction is performed on the measured water-suppressed time-sequential signal in order to change the recorded phase changes in the non-water-suppressed time-sequential signals into a specific phase characteristic.

According to a magnetic response imaging system of the present invention, even when a resonant frequency varies along with a change in a static magnetic field, a magnetic resonance spectrum having an SNR thereof improved owing to the effect of averaging can be provided.

BEST MODE FOR CARRYING OUT THE INVENTION

Embodiments of the present invention will be described below with reference to the drawings.

Figure 1A:
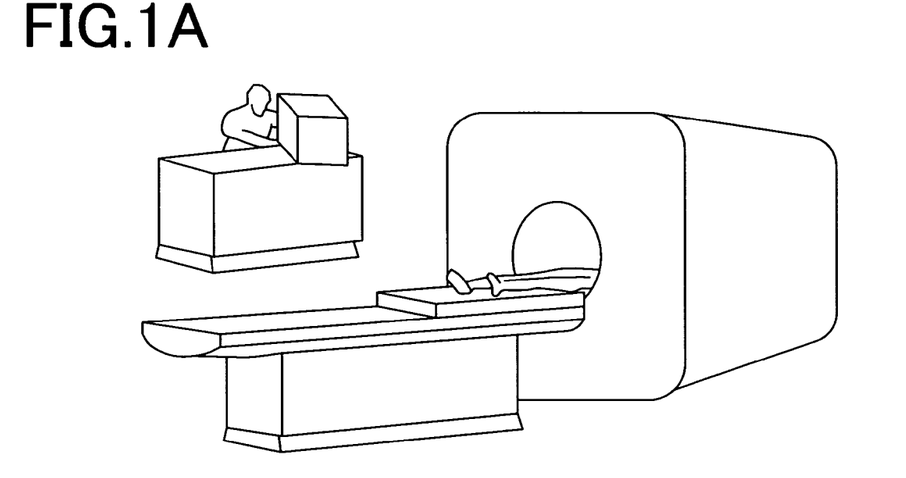
FIGS. 1A to 1C show the appearances of magnetic resonance imaging systems to which the present invention is adapted.
Figure 1B:
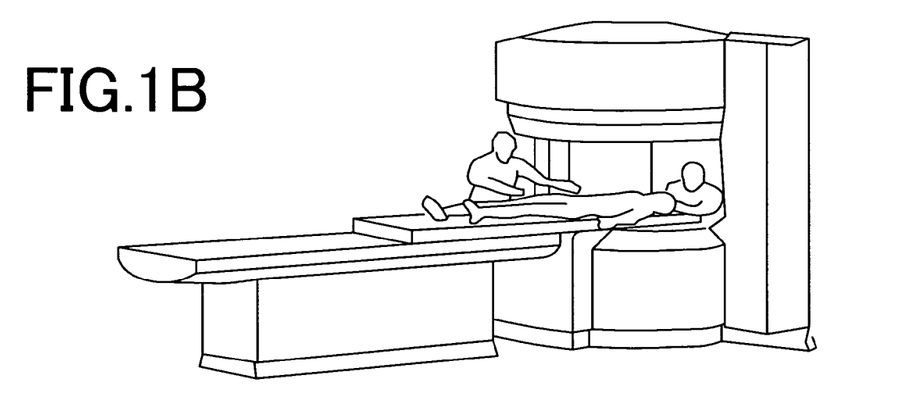
Figure 1C:
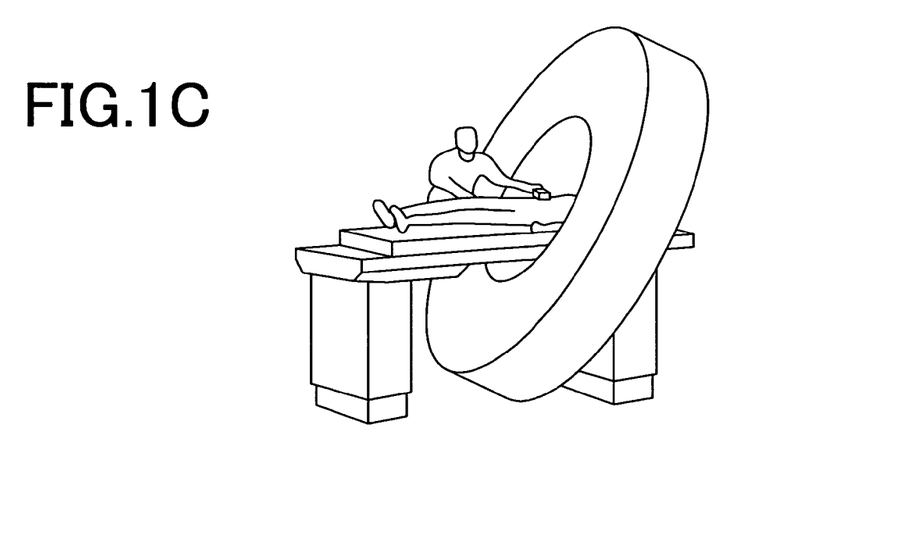

FIGS. 1A to 1C show the appearances of magnetic resonance imaging systems to which the present invention is adapted. FIG. 1A shows a magnetic resonance imaging system that adopts a tunneled magnet that uses a solenoid coil to generate a static magnetic field. FIG. 1B shows a hamburger-shaped magnetic resonance imaging system having a magnet thereof split up and down in order to improve a liberated feeling. FIG. 1C shows a tunnel-shaped magnetic resonance imaging system similar to the one shown in FIG. 1A, wherein the depth of a magnet is short and the magnet is tilted in order to improve the liberated feeling.

Figure 2:
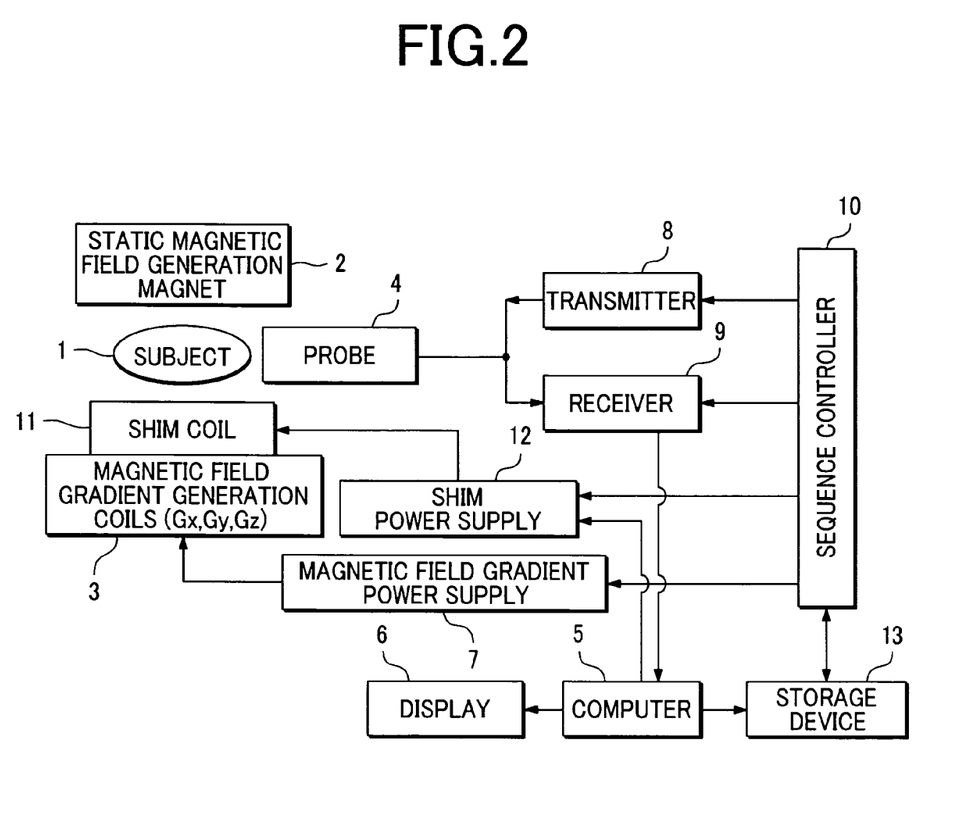
FIG. 2 shows an example of the configuration of a magnetic resonance imaging system to which the present invention is adapted.

FIG. 2 shows an example of the configuration of a magnetic resonance imaging system to which the present invention is adapted.

A subject 1 is placed in a space in which a static magnetic field generated by a static magnetic field generation magnet 2 and magnetic field gradients oriented in three orthogonal directions and generated by magnetic field gradient generation coils 3 are applied. A shim coil 11 may be included so that the uniformity of the static magnetic field can be adjusted by changing currents that are caused to flow through the respective coils. A generated radiofrequency magnetic field is irradiated to the subject 1 using a probe 4, whereby a magnetic resonance phenomenon takes place. The probe 4 is used to detect a magnetic resonance signal induced in the subject 4. The irradiated radiofrequency magnetic field is delivered by a transmitter 8, and a detected magnetic resonance signal is transmitted to a computer 5 via a receiver 9. The computer 5 performs various computations on the magnetic resonance signal so as to produce spectral information and image information. The pieces of information are displayed on a display 6 or stored in a storage device 13 (if necessary, conditions for measurement are stored in the storage device 13). A power supply 12 for driving the shim coil 11, a power supply 7 for driving the magnetic field gradient generation coils 3, the transmitter 8, and the receiver 9 are controlled by the sequence controller 10.

FIG. 2 shows an example in which the probe 4 is used for both transmission and reception. A transmission probe and a reception probe may be included separately.

Figure 3:
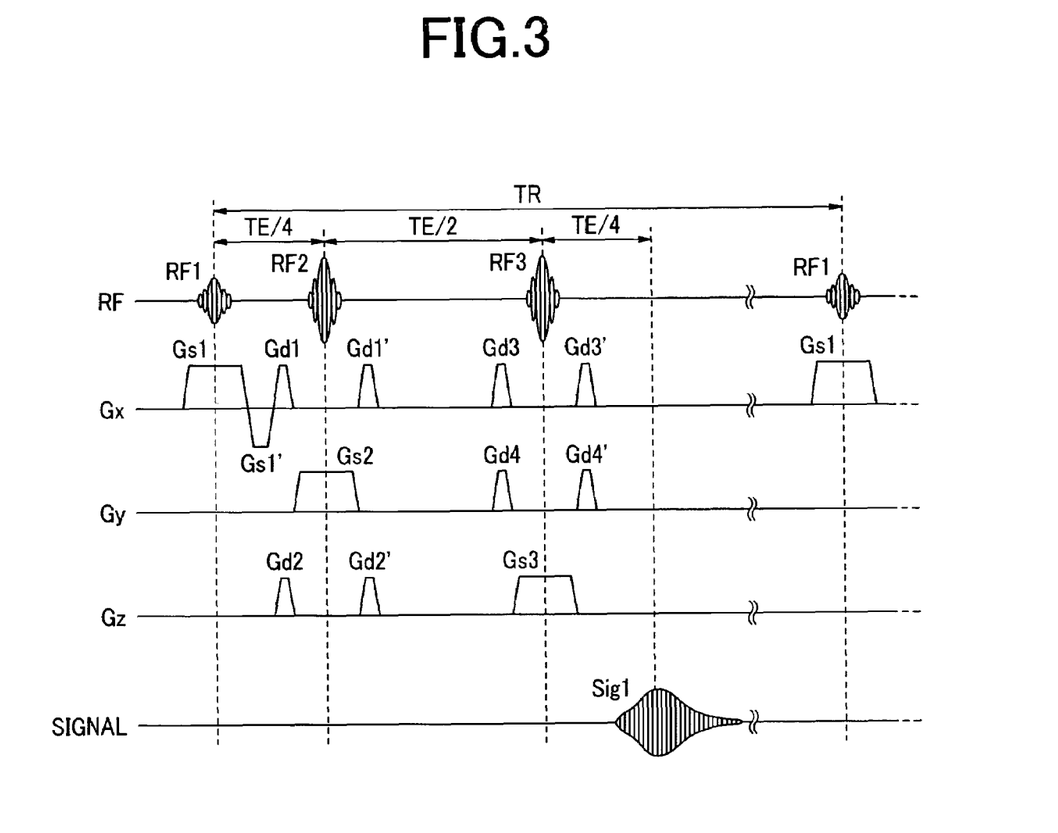
FIG. 3 shows an example of an MRS pulse sequence employed in an embodiment of the present invention.

FIG. 3 shows an example of a pulse sequence for MRS measurement (MRS pulse sequence) employed in the embodiment of the present invention.

According to the MRS pulse sequence shown in FIG. 3, first, the first magnetic field gradient Gs1 (a magnetic field gradient in an X-axis direction) with which the first slice (plane perpendicular to the X axis) is selected and the first radiofrequency magnetic field RF1 called a 90° pulse are applied simultaneously. Consequently, nuclear magnetizations on the first slice are excited. Herein, TE denotes an echo time and TR denotes a repetition time. In a TE/4 from irradiation of the pulse RF1, the second magnetic field gradient (a magnetic field gradient in a Y-axis direction) with which the second slice (plane perpendicular to the Y axis) is selected and the second radiofrequency magnetic field RF2 called a 180° pulse are applied simultaneously. Consequently, among the nuclear magnetizations contained in the first slice and excited with the pulse RF1, nuclear magnetizations also contained in the second slide are 180° inverted. Furthermore, in a TE/2 from irradiation of the pulse RF2, the third magnetic field gradient (a magnetic field gradient in a Z-axis direction) Gs3 with which the third slice (plane perpendicular to the Z axis) is selected and the third radiofrequency magnetic field RF3 called a 180° pulse are applied simultaneously. Consequently, among the nuclear magnetizations contained in an area of intersection between the first and second slices and inverted with the pulse RF2, nuclear magnetizations also contained in the third slice are 180° inverted. The applications of the three pairs of the radiofrequency magnetic field and magnetic field gradient generate a magnetic resonance echo signal Sig1 relative to which an echo time ends in the TE/4 from the irradiation of the pulse RF3. Herein, an example in which the irradiation of the pulse RF is performed three times has been introduced. The irradiation of the pulse RF should be performed at least once.

A magnetic field gradient Gs1' to be applied immediately after the application of the magnetic field gradient Gs1 is a magnetic field gradient intended for the rephasing of the spins that have been dephased by the magnetic field gradient Gs1. Moreover, magnetic field gradients Gd1 and Gd1' and magnetic field gradients Gd2 and Gs2' that are applied before and after the application of the pulse RF2 are magnetic field gradients intended not to disturb the phases of the nuclear magnetizations excited with the irradiation of the pulse RF1 (that is, the magnetic field gradients Gd1 and Gd1' cancel a phase change, and the magnetic field gradients Gd2 and Gs2' cancel the phase change) but to dephase the nuclear magnetizations excited with the irradiation of the pulse RF2. Furthermore, magnetic field gradients Gd3 and Gd3' and magnetic field gradients Gd4 and Gd4' that are applied before and after the application of the pulse RF3 are magnetic field gradients intended not to disturb the phases of the nuclear magnetizations excited with the irradiation of the pulse RF1 (that is, the magnetic field gradients Gd3 and Gd3' cancel the phase change, and the magnetic field gradients Gd4 and Gd4' cancel the phase change) but to dephase the nuclear magnetizations excited with the irradiation of the pulse RF3.

By executing the pulse sequence shown in FIG. 3, a magnetic resonance signal generated from an area of intersection among the three slices (an imaging voxel) V1 can be measured, and the measured magnetic resonance signal is Fourier-transformed (FT) in order to obtain a magnetic resonance spectrum representing the imaging voxel V1. Normally, a SINC waveform (sin(t)/t) expressing an excitation frequency characteristic of a rectangular wave is often adopted for the first radiofrequency magnetic field RF1 and second radiofrequency magnetic field RF2.

As mentioned above, when MRS measurement is performed with a water signal non-suppressed, a feeble signal from a metabolite is buried in the skirt extending from a peak of a strong signal from a water molecule. It becomes quite difficult to separate or sample the feeble metabolite signal. Consequently, when the MRS measurement is performed in order to detect the metabolite signal, a pre-pulse sequence intended to suppress the water signal is performed immediately previously of excitation and detection to be achieved according to the sequence shown in FIG. 3.

Figure 4:
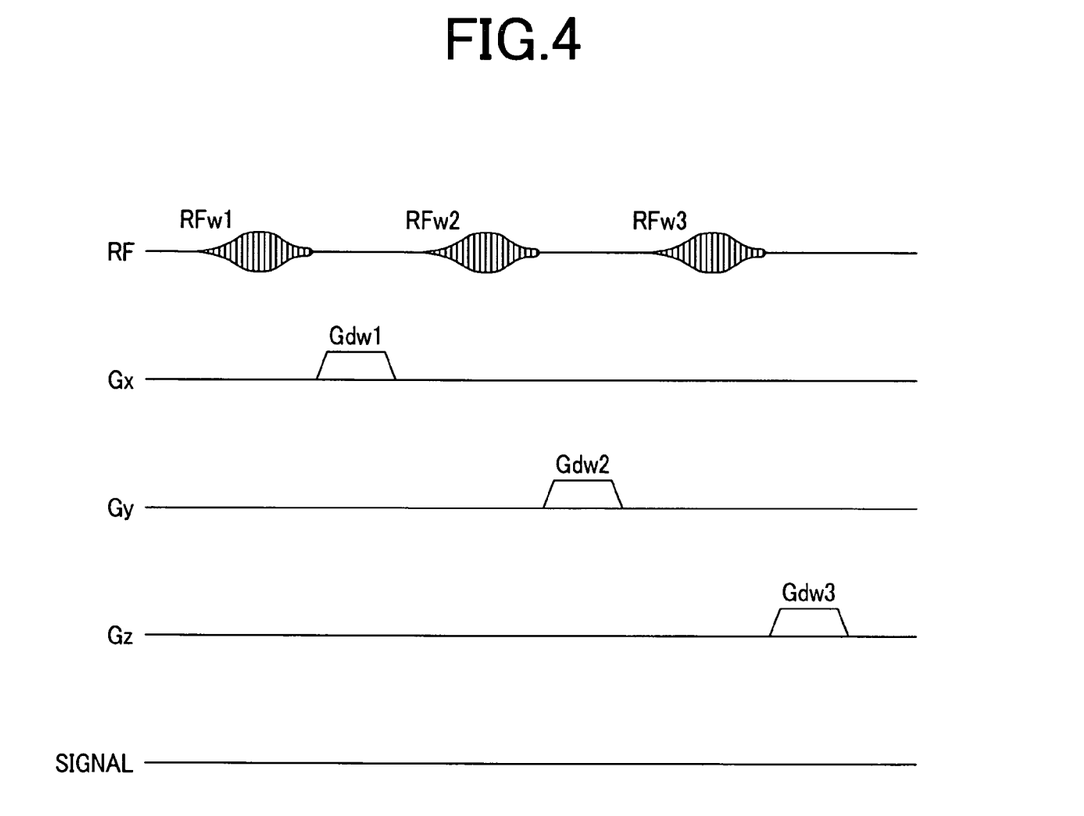
FIG. 4 shows an example of a pulse sequence for suppressing a water signal which is employed in an embodiment of the present invention.

FIG. 4 shows an example of the pre-pulse sequence (water signal suppression pulse sequence) intended to suppress a water signal and employed in the embodiment of the present invention, thus presenting a known water signal suppression method (refer to Non-patent Document 2).

According to the pulse sequence shown in FIG. 4, first, a radiofrequency magnetic field (water excitation radiofrequency magnetic field) RFw1 is irradiated with a transmission frequency Ft therefor set to the resonant frequency Fw of water and an excitation frequency band ΔFt set to a value close to the peak width ΔFw of a water signal. This is intended to excite nuclear magnetizations contained in only water molecules (selective excitation of nuclear magnetizations in water). Thereafter, the phases of the excited nuclear magnetizations in water are differentiated from one another. A dephasing magnetic field gradient Gdw1 is applied in order to nullify the sum of the nuclear magnetization vectors in water (pseudo saturation of water nuclear magnetizations). Furthermore, the application of a radiofrequency magnetic field and a dephasing magnetic field gradient similar to the water excitation radiofrequency magnetic field RFw1 and dephasing magnetic field gradient Gdw1 respectively is often repeated about three times (repeated three times according to the sequence shown in FIG. 4). Incidentally, the Gaussian waveform expressing an excitation frequency characteristic of a narrow band is often adopted for the radio frequency magnetic field RFw1. The example shown in FIG. 4 is an example in which any of the magnetic field gradients Gx, Gy, and Gz is applied as the dephasing magnetic field gradient. Alternatively, all of the magnetic field gradients Gx, Gy, and Gz may be applied simultaneously, or two of the magnetic field gradients Gx, Gy, and Gz may be applied simultaneously. While the pseudo saturation of water nuclear magnetizations continues, if the sequence shown in FIG. 3 is executed succeedingly to the sequence shown in FIG. 4, a feeble signal of a metabolite can be measured.

Normally, a flip angle to be produced by the water excitation radiofrequency magnetic field RFw is set to about 90°. As for the dephasing magnetic field gradient Gdw, various combinations or numerical values can be adopted as the number of axes of application and applied strength. Normally, a signal of a metabolite capable of being detected in vivo is often quite feeble. Therefore, measurement is repeated multiple times in order to improve the SNR of an obtained spectrum. Acquired signals are then summated (averaging).

Figure 5:
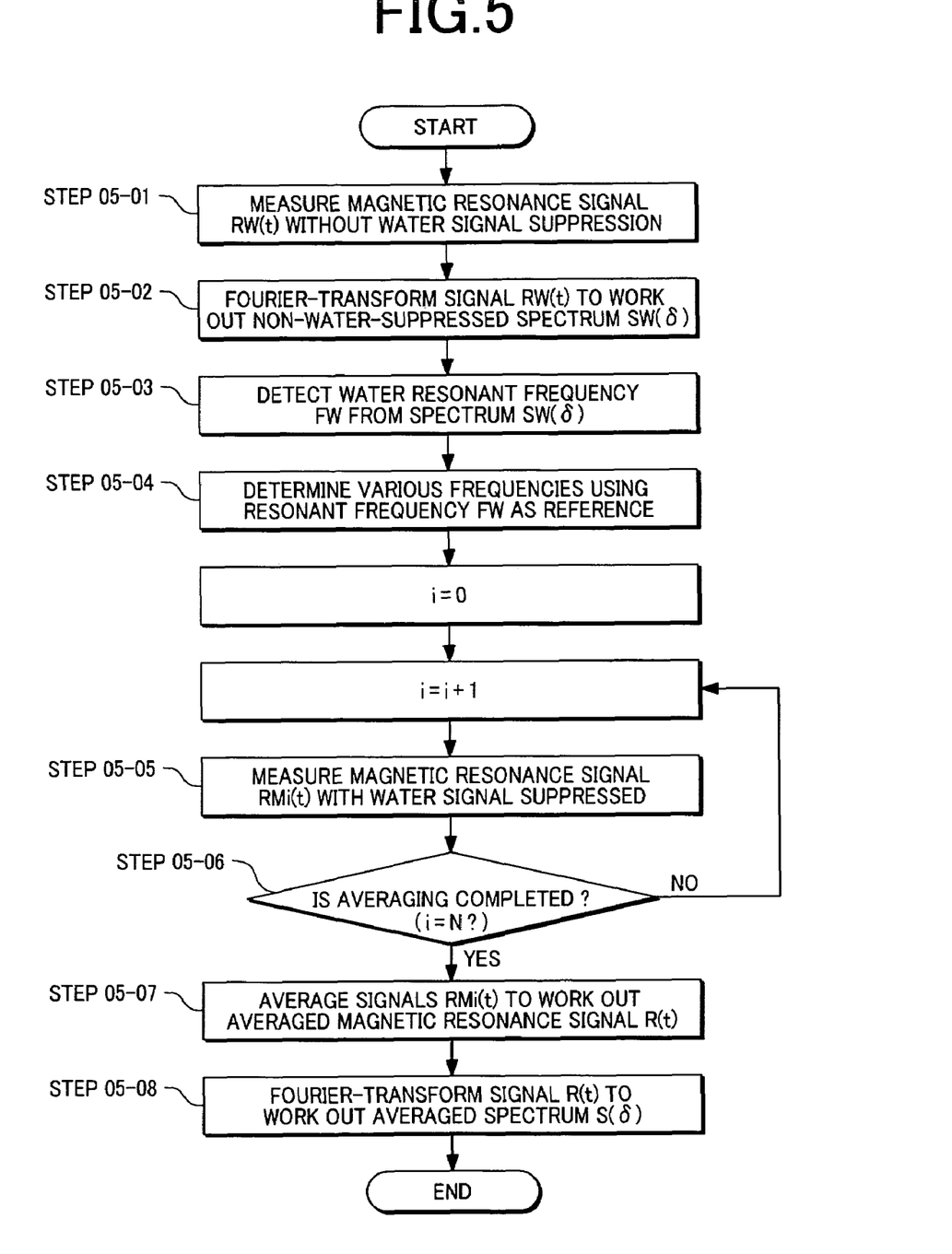
FIG. 5 is a flowchart describing a conventional MRS measurement procedure.

FIG. 5 is a flowchart describing an example of a conventional MRS measurement procedure to be performed on the assumption that the static magnetic field strength remains temporally constant (resonant frequency remains constant). The imaging procedure will be outlined below.

Step 05-01: the MRS sequence shown in FIG. 3 is used to acquire a magnetic resonance signal RW(t) from a voxel V1 to be measured (where RW(t) denotes complex-number data including complex numbers relevant to M points juxtaposed time-sequentially (t denotes 1, 2, 3, etc., or M, for example, 4096)).

Step 05-02: the magnetic resonance signal RW(t) is Fourier-transformed (FT) in order to work out a magnetic resonance spectrum SW($\delta$) (where SW($\delta$) denotes complex-number data including complex numbers relevant to M points ($\delta$ denotes 1, 2, 3, etc., or M, for example, 4096)).

Step 05-03: a water-signal peak position $\delta$W is detected from the magnetic resonance spectrum SW($\delta$), and a water resonant frequency FW is calculated and recorded (normally, a point indicating the largest signal strength is regarded as the water-signal peak position $\delta$W).

Step 05-04: using the FW value as a reference, the transmission frequency for the radiofrequency magnetic field to be irradiated during processing intended to suppress a water signal, the transmission frequency for the radiofrequency magnetic field to be irradiated in order to selectively excite the imaging voxel V1, and the reception frequency for detection of a magnetic resonance signal generated from the imaging voxel V1 are determined.

Step 05-05: a main-scan sequence intended to acquire a metabolite signal (measurement during which the water-signal suppression pulse sequence shown in FIG. 4 and the MRS sequence shown in FIG. 3 are performed successively) is executed in order to measure a magnetic resonance signal RM1(t) generated from the imaging voxel V1 (where RM1(t) denotes complex-number data including complex numbers relevant to M points juxtaposed time-sequentially (t denotes 1, 2, 3, etc., or M, for example, 4096)).

Step 05-06: step 05-05 is repeated N times equal to the number of times of averaging in order to acquire N magnetic resonance signals RMi(t) (where i denotes 1, 2, 3, etc., or N, and RMi(t) denotes complex-number data including complex numbers relevant to M points juxtaposed time-sequentially (t denotes 1, 2, 3, etc., or M, for example, 4096)).

Step 05-07: the N magnetic resonance signals RMi(t) are summated in order to work out an averaged magnetic resonance signal R(t) (where R(t) denotes complex-number data including complex numbers relevant to M points juxtaposed time-sequentially (t denotes 1, 2, 3, etc., or M, for example, 4096)).

Step 05-08: The magnetic resonance signal R(t) is Fourier-transformed in order to work out an averaged spectrum S($\delta$) (where S($\delta$) denotes complex-number data including complex numbers relevant to M points ($\delta$ denotes 1, 2, 3, etc., or M, for example, 4096)).

According to the measurement procedure described in FIG. 5, a transmission frequency for irradiation of a radiofrequency magnetic field and a reception frequency for detection of a magnetic resonance signal are determined on the assumption that the static magnetic field strength remains temporally constant. Measured signals are averaged as they are. If the static magnetic field strength temporally changes for some reason, the position of a measured peak shifts along with an increase in the number of times of averaging. Consequently, the effect of averaging is not fully provided.

First Embodiment

Figure 6:
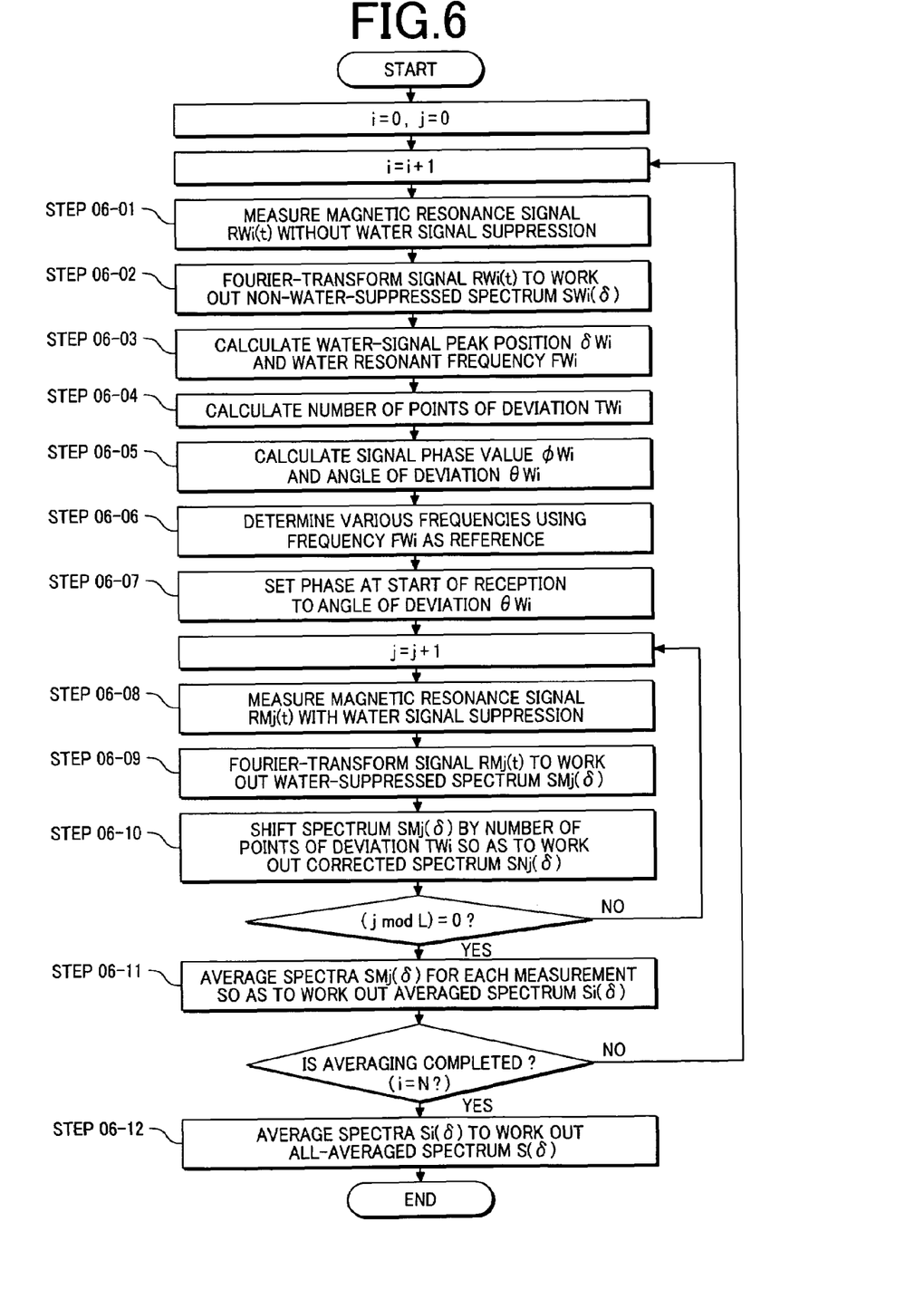
FIG. 6 is a flowchart describing a MRS measurement procedure employed in the first embodiment of the present invention (first embodiment)

FIG. 6 shows an imaging procedure employed in the first embodiment of the present invention.

In the present embodiment, during water-suppressed spectrum measurement (main scan) accompanied by repetitive measurement intended for averaging of signals, non-water-suppressed spectrum measurement (pre-scan) is performed cyclically in order to cyclically detect a water resonant frequency (water-signal peak position) and a phase value at the water-signal peak from an obtained non-water-suppressed spectrum (the cyclic pre-scan makes it possible to sense the time-varying rate of the static magnetic field strength (resonant frequency)). During the water-suppressed spectrum measurement (main scan) succeeding the pre-scan, a reception-initiating phase value that is used for detection of a magnetic resonance signal is set to a value calculated from a phase value at the water-signal peak position detected during the pre-scan. For averaging of measured magnetic resonance signals, after data items are shifted by the value calculated from the phase value at the water-signal peak position detected during the pre-scan, the averaging is performed.

Step 06-01: the MRS sequence shown in FIG. 3 is used to acquire a magnetic resonance signal RWi(t) generated from the voxel V1 to be measured without water signal suppression (where i denotes 1, and RWi(t) denotes complex-number data including complex numbers relevant to M points juxtaposed time-sequentially (t denotes 1, 2, 3, etc., or M, for example, 4096)).

Step 06-02: the time-sequential signal RWi(t) is Fourier-transformed in order to work out a magnetic resonance spectrum SWi($\delta$) (where SWi($\delta$) denotes complex-number data including complex numbers relevant to M points ($\delta$ denotes 1, 2, 3, etc., or M, for example, 4096)).

Step 06-03: a water-signal peak position $\delta$Wi is detected from the magnetic resonance spectrum SWi($\delta$), and a water resonant frequency FWi is calculated and recorded (normally, a point indicating the largest signal strength is regarded as the water-signal peak position $\delta$Wi).

Step 06-04: the number of points of deviation TWi by which the peak position $\delta$Wi deviates from a predetermined peak position $\delta$W0 is calculated and recorded (for example, assuming that the peak position $\delta$Wi is the 2046-th point and the predetermined peak position is the center point in the spectrum (2048-th point), the number of points of deviation TWi is calculated as 2046−2048=−2).

Step 06-05: an angle of deviation $\theta$Wi by which a signal phase value $\phi$Wi at the peak position $\delta$Wi deviates from a predetermined phase value $\phi$W0 is calculated and recorded (for example, assuming that the signal phase value $\phi$Wi is 30° and the predetermined phase value $\phi$W0 is 0°, the angle of deviation $\theta$Wi is calculated as 0−30=−30°).

Step 06-06: using the value of the water resonant frequency FWi as a reference, a transmission frequency for a radiofrequency magnetic field to be irradiated during water signal suppression, a transmission frequency for a radiofrequency magnetic field to be irradiated in order to selectively excite the imaging voxel V1, and a reception frequency for detection of a magnetic resonance signal generated from the imaging voxel V1 are determined.

Step 06-07: the angle of deviation $\theta$Wi is designated as the reception-initiating phase value.

Step 06-08: the main-scan sequence for acquiring a metabolite signal (measurement during which the water-signal suppression pulse sequence shown in FIG. 4 and the MRS sequence shown in FIG. 3 are successively performed)

is executed in order to measure a magnetic resonance signal RMj(t) generated from the imaging voxel V1 (where j denotes 1, and RMj(t) denotes a complex-number data including complex numbers relevant to M points juxtaposed time-sequentially (t denotes 1, 2, 3, etc., or M, for example, 4096)).

Step 06-09: the magnetic resonance signal RMj(t) is Fourier-transformed in order to work out a magnetic resonance spectrum SMj(δ) (where SMj(δ) denotes complex-number data including complex numbers relevant to M points (δ denotes 1, 2, 3, etc., or M, for example, 4096)).

Step 06-10: processing intended to shift (turn) the peak position by the number of points of deviation TWi is performed on the magnetic resonance spectrum SMj(δ) in order to work out a corrected spectrum SNj(δ) (for example, assuming that the number of points of deviation TWi denotes −2, a signal SNj(k) at the k-th point in the corrected spectrum SNj(δ) is represented by data SMj(k−(−2)) in case of k≦(M+(−2)), and represented by data SMj(k−(−2)−M) in case of k>(M+(−2)). That is, the data items SMj(1) (start point), SMj(2), SMj(3), etc., SMj(2048) (center point), etc., SMj(4094), SMj(4095), and SMj(4096) (end point) that are arranged in that order before the completion of shifting are rearranged in the order of data items SMj(3) (start point), SMj(4), SMj(5), etc., SMj(2046) (center point), etc., SMj (4096), SMj(1), and SMj(2) (end point)).

Step 06-11: the processing from step 06-08 to step 06-10 is repeated a predetermined number of times L (for example, ten times) smaller than the total number of times of averaging N (for example, 300 times) in order to acquire L magnetic resonance spectra SMj(δ) (where j denotes 1, 2, 3, etc., or L). The magnetic resonance spectra SMj(δ) are summated for each measurement in order to work out an averaged spectrum Si(δ).

Step 06-12: the processing from step 06-01 to step 06-11 is repeated in order to measure the same number of main-scan spectra SMj(δ) (where j denotes 1, 2, 3, etc., or M) as the total number of times of averaging N. The calculated N/L (for example, 30) averaged spectra Si(δ) (where i denotes 1, 2, 3, etc., or N/L) are summated in order to obtain an all-averaged spectrum S(δ).

By performing the foregoing series of pieces of processing, even if a resonant frequency varies along with a change in a static magnetic field, a spectrum in which a peak position matches with a signal phase can be repeatedly measured, and a spectrum signal having the SNR improved due to the effect of averaging can be obtained. For example, assuming that the resonant frequency varies at a rate ranging from 0.2 to 0.4 Hz/min, when the present embodiment is applied, the full-width at the half-maximum in a spectrum obtained during a measurement time of seven min is reduced about 30%. Improvement in a spectral resolution is expected. As for the SNR, a theoretical effect of averaging (improvement by a square of the number of times of averaging) is available.

Second Embodiment

Figure 7:
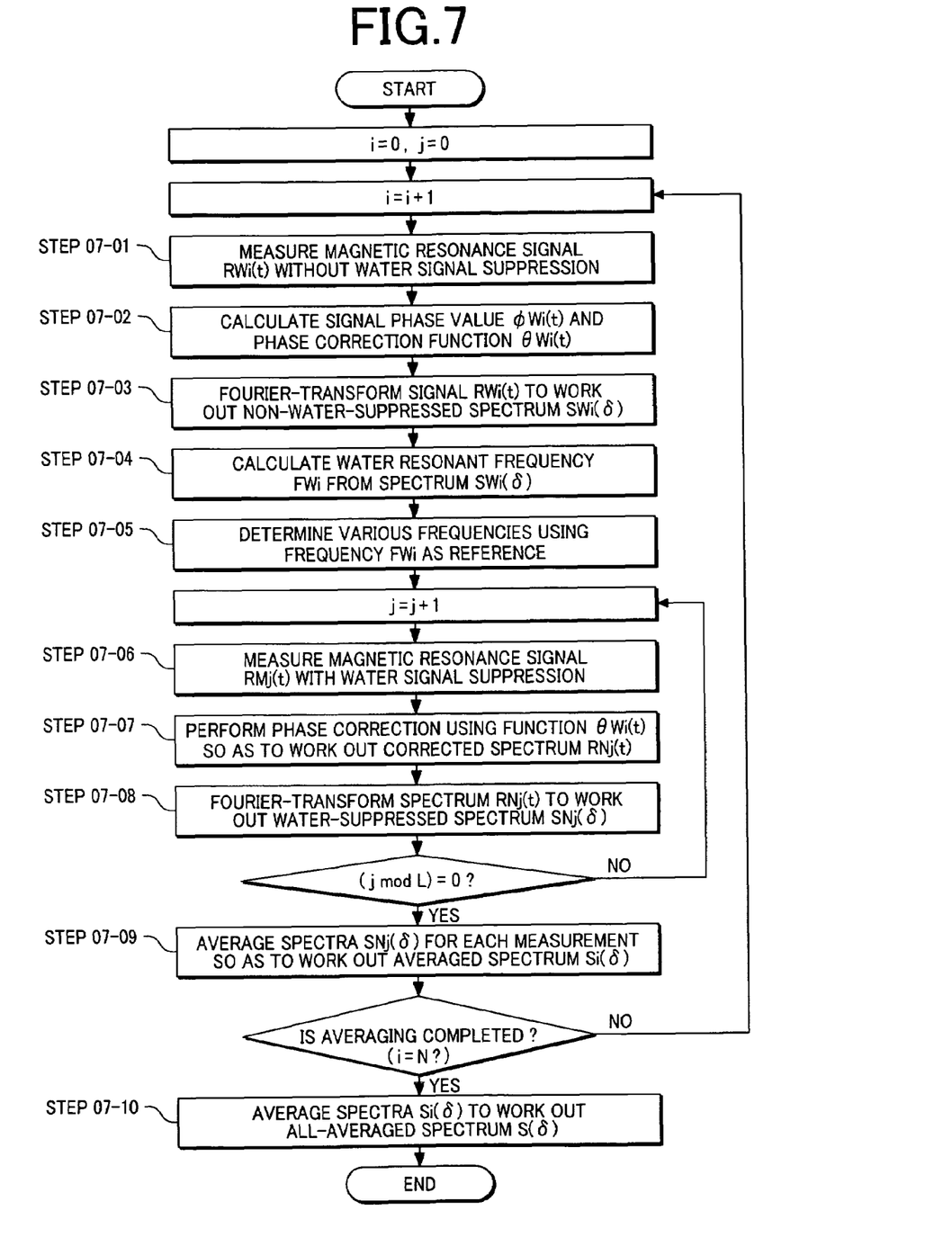
FIG. 7 is a flowchart describing an MRS measurement procedure employed in the second embodiment of the present invention (second embodiment).

FIG. 7 described an imaging procedure employed in the second embodiment of the present invention.

In the present embodiment, non-water-suppressed spectrum measurement (pre-scan) is cyclically performed during water-suppressed spectrum measurement (main scan) accompanied by repetitive measurement intended for averaging of signals. A phase change in an obtained non-water-suppressed time-sequential signal is detected and recorded. The cyclic pre-scan makes it possible to sense a time-varying rate of static magnetic field strength (resonant frequency). During the water-suppressed spectrum measurement (main scan) succeeding the pre-scan, phase correction is performed on a measured water-suppressed time-sequential signal in order to change the recorded phase changes in the non-water-suppressed time-sequential signals into a predetermined phase characteristic.

Step 07-01: the MRS sequence shown in FIG. 3 is used to acquire a magnetic resonance signal RWi(t) generated from a voxel V1 to be measured (where i denotes 1, and RWi(t) denotes complex-number data including complex numbers relevant to M points juxtaposed time-sequentially (t denotes 1, 2, 3, etc., or M, for example, 4096)).

Step 07-02: after a signal phase value φWi(t) is calculated relative to each of the points represented by the time-sequential signal RWi(t) (where φWi(t) denotes real-number data including real numbers relevant to M points (t denotes 1, 2, 3, etc., or M, for example, 4096)), a phase correction function θWi(t) for changing the phase characteristic φWi(t) into a predetermined phase characteristic φW0(t) is calculated and recorded (for example, assuming that the signal phase values φWi(t) are corrected to be 0° (φW0(t)=0), the function θWi(t) is calculated as 0−φWi(t)=−φWi(t)).

Step 07-03: the time-sequential signal RWi(t) is Fourier-transformed in order to work out a magnetic resonance spectrum SWi(δ) (where SWi(δ) is complex-number data including complex numbers relevant to M points (δ denotes 1, 2, 3, etc., or M, for example, 4096)).

Step 07-04: a water-signal peak position δWi is detected in the magnetic resonance spectrum Swi(δ), and a water resonant frequency FWi is calculated and recorded (normally, a point indicating the largest signal strength is regarded as the water-signal peak position δWi).

Step 07-05: using the water resonant frequency FWi as a reference, a transmission frequency for a radiofrequency magnetic field to be irradiated during water-signal suppression, a transmission frequency for a radiofrequency magnetic field to be irradiated in order to selectively excite the imaging voxel V1, and a reception frequency for detection of a magnetic resonance signal generated from the imaging voxel V1 are determined.

Step 07-06: a main-scan sequence for acquiring a metabolite signal (measurement during which the water-signal suppression pulse sequence shown in FIG. 4 and the MRS sequence shown in FIG. 3 are successively executed) is executed in order to measure a magnetic resonance signal RMj(t) generated from the imaging voxel V (where j denotes 1, and RMj(t) denotes complex-number data including complex numbers relevant to M points (t denotes 1, 2, 3, etc., or M, for example, 4096)).

Step 07-07: phase correction is performed on the magnetic resonance signal RMj(t) using the phase correction function θWi(t) in order to workout a corrected magnetic resonance signal RNj(t).

Step 07-08: the corrected magnetic resonance signal RNj(t) is Fourier-transformed in order to work out a corrected magnetic resonance spectrum SNj(δ) (where SNj(δ) denotes complex-number data including complex numbers relevant to M points (δ denotes 1, 2, 3, etc., or M, for example, 4096)).

Step 07-09: the processing from step 07-06 to step 07-08 is repeated a predetermined number of times L (for example, ten times) smaller than the total number of times of averaging N (for example, 300 times) in order to obtain L corrected magnetic resonance spectra SNj(δ) (where j denotes 1, 2, 3, etc., or L) The spectra SNj(δ) are summated for each measurement in order to work out an averaged spectrum Si(δ).

Step 07-10: the processing from step 07-01 to step 07-09 is repeated in order to measure the same number of main-scan spectra SNj(δ) (where j denotes 1, 2, 3, etc., or N) as the total number of times of averaging N. The calculated N/L averaged spectra Si(δ) (where i denotes 1, 2, 3, etc., or N/L) (for example, 30 spectra) are summated in order to obtain an all-averaged spectrum S(δ).

By performing the foregoing sequence of pieces of processing, even if a resonance frequency varies along with a change in a static magnetic field, a spectrum signal having an SNR thereof improved due to the effect of averaging can be obtained in the same manner as it is in the first embodiment.

As mentioned above, phase correction in which a phase characteristic of a magnetic resonance signal obtained with a water signal non-suppressed is adopted as a reference is known to have the effect of minimizing a distortion of a magnetic resonance signal caused by eddy currents induced by a magnetic field gradient (effect of correcting eddy currents). Since the second embodiment is advantageous in that a reference phase characteristic employed in the phase correction is cyclically measured (updated), even if a resonant frequency varies along with a change in a static magnetic field, the eddy-currents effect can be obtained stably.

As described previously, according to the magnetic resonance imaging system of the present invention, even if a resonant frequency varies along with a change in a static magnetic field, a satisfactory magnetic resonance spectrum having an SNR improved due to the effect of averaging can be provided.

INDUSTRIAL APPLICABILITY

As described so far, according to the magnetic resonance imaging system of the present invention, even if a resonant frequency varies along with a change in a static magnetic field, a satisfactory magnetic resonance spectrum having an SMR improved due to the effect of averaging can be provided.

The invention claimed is:

1. A magnetic resonance imaging system, comprising:
a means for generating a static magnetic field;
a radiofrequency magnetic field generation means for generating a radiofrequency magnetic field that is applied to a subject placed in the static magnetic field;
a magnetic field gradient generation means for generating a magnetic field gradient that is applied to the subject;
a measurement means for measuring a magnetic resonance signal generated from the subject;
an arithmetic means for computing the magnetic resonance signal;
a storage means in which the magnetic resonance signal and the results of computation performed by the arithmetic means are stored; and
a sequence control means for controlling the actions of the respective pieces of means, wherein:
the sequence control means extends control for irradiating the radiofrequency magnetic field to the subject at least once, measuring the magnetic resonance signal, which is generated after the irradiation of the radiofrequency magnetic field, with the applied strength of the magnetic field gradient nearly nullified, calculating information on a magnetic resonance spectrum using the measured magnetic resonance signal, and thus measuring the magnetic resonance spectrum; and
when the sequence control means repeats the measurement of the magnetic resonance signal a plurality of times, the sequence control means extends at least one of:
(1) control for performing a pre-scan, which is intended to measure the position of a peak of a water signal and a signal phase, at least once during the repetition of the measurement of the magnetic resonance signal;
(2) control for detecting a magnitude of deviation, by which the water-signal peak position deviates from a predetermined reference position, using a magnetic resonance spectrum resulting from Fourier transform of the magnetic resonance signal obtained during the pre-scan;
(3) control for calculating the signal phase value at the water-signal peak position detected as mentioned in (2); and
(4) control for designating a reception-initiating phase value, which is used to measure the magnetic resonance signal during the spectrum measurement to be performed succeedingly to the pre-scan, on the basis of the signal phase value calculated as mentioned in (3), and for shifting the magnetic resonance spectrum, which results from Fourier transform of the magnetic resonance signal obtained during the spectrum measurement performed succeedingly to the pre-scan, by the magnitude of deviation on the basis of the water-signal peak position detected as mentioned in (2).

2. The magnetic resonance imaging system according to claim 1, wherein the sequence control means extends control for performing the pre-scan for each of a predetermined number of times of measurement of the magnetic resonance signal.

3. The magnetic resonance imaging system according to claim 1, further comprising a display means for displaying the magnetic resonance signal and the results of computation performed by the arithmetic means.

4. A magnetic resonance imaging system, comprising:
a means for generating a static magnetic field;
a radiofrequency magnetic field generation means for generating a radiofrequency magnetic field that is applied to a subject placed in the static magnetic field;
a magnetic field gradient generation means for generating a magnetic field gradient that is applied to the subject;
a measurement means for measuring a magnetic resonance signal generated from the subject;
an arithmetic means for computing the magnetic resonance signal;
a storage means in which the magnetic resonance signal and the results of computation performed by the arithmetic means are stored; and
a sequence control means for controlling the actions of the respective pieces of means, wherein:
the sequence control means extends control for irradiating the radiofrequency magnetic field to the subject at least once, measuring the magnetic resonance signal, which is generated after the irradiation of the radiofrequency magnetic field, with the applied strength of the magnetic field gradient nearly nullified, calculating information on a magnetic resonance spectrum using the measured magnetic resonance signal, and thus measuring the magnetic resonance spectrum; and
when the sequence control means repeats the measurement of the magnetic resonance signal a plurality of times, the sequence control means extends:

(1) control for performing a pre-scan, which is intended to measure the position of a peak of a water signal and a signal phase, for each of a predetermined number of times of measurement of the magnetic resonance signal;

(2) control for detecting a water-signal peak position (δ) from a magnetic resonance spectrum that results from Fourier transform of the magnetic resonance signal obtained during the pre-scan, and then calculating the number of points of deviation (δ−δc) by which the peak position (δ) deviates from a predetermined peak position (δc);

(3) control for calculating a signal phase value (φ) at the water-signal peak position in the magnetic resonance spectrum that results from Fourier transform of the magnetic resonance signal obtained during the pre-scan, and then calculating an angle of deviation (−φ) by which the signal phase value (φ) deviates from a predetermined phase value (0°);

(4) control for designating the angle of deviation (−φ), which is calculated as mentioned in (3), as a reception-initiating phase value that is used to measure the magnetic resonance signal during the spectrum measurement performed succeedingly to the pre-scan; and (5) control for shifting a magnetic resonance spectrum, which results from Fourier transform of the magnetic resonance signal obtained during the spectrum measurement performed succeedingly to the pre-scan, by the number of points of deviation (δ−δc) calculated as mentioned in (2).

5. A magnetic resonance imaging system, comprising:
a means for generating a static magnetic field;
a radiofrequency magnetic field generation means for generating a radiofrequency magnetic field that is applied to a subject placed in the static magnetic field;
a magnetic field gradient generation means for generating a magnetic field gradient that is applied to the subject;
a measurement means for measuring a magnetic resonance signal generated from the subject;
an arithmetic means for computing the magnetic resonance signal;
a storage means in which the magnetic resonance signal and the results of computation performed by the arithmetic means are stored; and
a sequence control means for controlling the actions of the respective pieces of means, wherein:
the sequence control means extends control for irradiating the radiofrequency magnetic field to the subject at least once, measuring the magnetic resonance signal, which is generated after the irradiation of the radiofrequency magnetic field, with the applied strength of the magnetic field gradient nearly nullified, calculating information on a magnetic resonance spectrum using the measured magnetic resonance signal, and thus measuring the magnetic resonance spectrum; and
when the sequence control means repeats the measurement of the magnetic resonance signal a plurality of times, the sequence control means extends:

(1) control for performing a pre-scan, which is intended to measure a phase change in a water signal, for each of a predetermined number of times of measurement of the magnetic resonance signal;

(2) control for calculating a signal phase value relative to each of points represented by the magnetic resonance signal obtained during the pre-scan; and (3) control for performing phase correction on a magnetic resonance signal, which is obtained during the spectrum measurement performed succeedingly to the pre-scan, on the basis of the signal phase value calculated as mentioned in (2).

6. A magnetic resonance imaging system, comprising:
a means for generating a static magnetic field;
a radiofrequency magnetic field generation means for generating a radiofrequency magnetic field that is applied to a subject placed in the static magnetic field;
a magnetic field gradient generation means for generating a magnetic field gradient that is applied to the subject;
a measurement means for measuring a magnetic resonance signal generated from the subject;
an arithmetic means for computing the magnetic resonance signal;
a storage means in which the magnetic resonance signal and the results of computation performed by the arithmetic means are stored; and
a sequence control means for controlling the actions of the respective pieces of means, wherein:
the sequence control means extends control for irradiating the radiofrequency magnetic field to the subject at least once, measuring the magnetic resonance signal, which is generated after the irradiation of the radiofrequency magnetic field, with the applied strength of the magnetic field gradient nearly nullified, calculating information on a magnetic resonance spectrum using the measured magnetic resonance signal, and thus measuring the magnetic resonance spectrum; and
when the sequence control means repeats the measurement of the magnetic resonance signal a plurality of times, the sequence control means extends:

(1) control for performing a pre-scan, which is intended to measure a phase change in a water signal, for each of a plurality of times of measurement of the magnetic resonance signal;

(2) control for calculating a signal phase value (φ(t)) relative to each of points represented by the magnetic resonance signal obtained during the pre-scan, and then calculating a phase correction function (−φ(t)) that changes the signal phase values (φ(t)) relevant to the respective points into a predetermined phase characteristic (φ0($t$)=0); and (3) control for performing phase correction on a magnetic resonance signal, which is obtained during the spectrum measurement performed succeedingly to the pre-scan, using the phase correction function (−φ(t)) calculated as mentioned in (2).

7. A magnetic resonance imaging method, comprising:
a step at which a measurement means measures a magnetic resonance signal, which is induced by a radiofrequency magnetic field irradiated to a subject at least once, with the applied strength of a magnetic field gradient nearly nullified;
a step at which an arithmetic means calculates information on a magnetic resonance spectrum using the measured magnetic resonance signal so as to thus measure the magnetic resonance spectrum; and
at least one of:

(1) a step at which a sequence control means performs a pre-scan, which is intended to measure the position of a peak of a water signal and a signal phase, at least once during measurement of the magnetic resonance signal;

(2) a step at which the sequence control means detects a magnitude of deviation, by which the water-signal peak position deviates from a predetermined reference position, from a magnetic resonance spectrum that results from Fourier transform of the magnetic resonance signal obtained during the pre-scan;

(3) a step at which the sequence control means calculates a signal phase difference at the water-signal peak position detected at the step (2); and (4) a step at which a reception-initiating phase value that is used to measure the magnetic resonance signal during the spectrum measurement performed succeedingly to the pre-scan is designated based on the signal phase value calculated at the step (3), and a magnetic resonance spectrum resulting from Fourier transform of a magnetic resonance signal obtained during the spectrum measurement performed succeedingly to the pre-scan is shifted by the magnitude of deviation.

8. The magnetic resonance imaging method according to claim 7, wherein the step of performing the pre-scan is performed during repetition at a step of performing measurement of the magnetic resonance signal a predetermined number of times.

9. A magnetic resonance imaging method, comprising:

a step at which a measurement means measures a magnetic resonance signal, which is induced by a radiofrequency magnetic field irradiated to a subject at least once, with the applied strength of a magnetic field gradient nearly nullified;

a step at which an arithmetic means calculates information on a magnetic resonance spectrum using the measured magnetic resonance signal so as to thus measure the magnetic resonance spectrum;

(1) a step at which a sequence control means performs a pre-scan, which is intended to measure a phase change in a water signal, during repetition of the measurement of the magnetic resonance signal;

(2) a step at which the sequence control means calculates a signal phase value relative to each of points represented by the magnetic resonance signal obtained during the pre-scan; and (3) a step at which the sequence control means performs phase correction on a magnetic resonance signal, which is obtained during the spectrum measurement performed succeedingly to the pre-scan, on the basis of the signal phase value calculated at the step (2).

* * * * *